(12) United States Patent
Takashima et al.

(10) Patent No.: US 11,862,686 B2
(45) Date of Patent: Jan. 2, 2024

(54) NITRIDE SEMICONDUCTOR DEVICE

(71) Applicant: Fuji Electric Co., Ltd., Kanagawa (JP)

(72) Inventors: Shinya Takashima, Tokyo (JP); Ryo Tanaka, Tokyo (JP); Katsunori Ueno, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 505 days.

(21) Appl. No.: 16/919,560

(22) Filed: Jul. 2, 2020

(65) Prior Publication Data
US 2021/0043737 A1 Feb. 11, 2021

(30) Foreign Application Priority Data
Aug. 9, 2019 (JP) .................................. 2019-147387

(51) Int. Cl.
*H01L 29/78* (2006.01)
*H01L 29/20* (2006.01)
(Continued)

(52) U.S. Cl.
CPC ...... *H01L 29/2003* (2013.01); *H01L 21/0254* (2013.01); *H01L 21/02175* (2013.01);
(Continued)

(58) Field of Classification Search
CPC ............. H01L 29/2003; H01L 21/0254; H01L 21/3245; H01L 29/7811; H01L 29/0619; H01L 29/0878
See application file for complete search history.

(56) References Cited

U.S. PATENT DOCUMENTS 9,171,900 B2    10/2015   Kizilyalli et al.
2015/0228736 A1*  8/2015  Sakakibara ......... H01L 29/7395
                                                257/330
(Continued)

FOREIGN PATENT DOCUMENTS

JP    2003-124515 A    4/2003
JP    2007-258578 A    10/2007
(Continued)

OTHER PUBLICATIONS

Japanese Office Action dated Jul. 25, 2023 in a counterpart Japanese patent application No. 2019-147387. (A machine translation (not reviewed for accuracy) attached.).

*Primary Examiner* — Benjamin P Sandvik
(74) *Attorney, Agent, or Firm* — CHEN YOSHIMURA LLP

(57) ABSTRACT

A method for manufacturing a nitride semiconductor device includes: selectively ion-implanting an element that is other than p-type impurities and n-type impurities into a first region in a first primary surface of a gallium nitride layer so as to generate crystal defects in the first region; selectively ion-implanting a p-type impurity into a second region in the gallium nitride layer, the second region being shallower than the first region in a depth direction and being within the first region in a plan view; and thermally treating said gallium nitride layer that has been ion-implanted with said element and said p-type impurity so as to thermally diffuse said p-type impurity in the second region into a third region that is within the first region and that surrounds a bottom and sides of the second region.

13 Claims, 11 Drawing Sheets

(51) Int. Cl.
- *H01L 21/02* (2006.01)
- *H01L 21/324* (2006.01)
- *H01L 21/225* (2006.01)
- *H01L 29/06* (2006.01)
- *H01L 29/08* (2006.01)

(52) U.S. Cl.
CPC ...... *H01L 21/2253* (2013.01); *H01L 21/3245* (2013.01); *H01L 29/0619* (2013.01); *H01L 29/0878* (2013.01); *H01L 29/7802* (2013.01); *H01L 29/7811* (2013.01); *H01L 29/7813* (2013.01)

(56) References Cited

U.S. PATENT DOCUMENTS

| | | |
|---|---|---|
| 2017/0271148 A1* | 9/2017 | Takashima ........ H01L 21/26546 |
| 2018/0012964 A1 | 1/2018 | Ueno et al. |
| 2019/0157264 A1* | 5/2019 | Yoshida .............. H01L 27/0716 |
| 2019/0304788 A1* | 10/2019 | Takashima ............ H01L 29/207 |
| 2020/0058735 A1 | 2/2020 | Naito |
| 2020/0194562 A1* | 6/2020 | Yoshimura ............ H01L 21/265 |
| 2020/0357903 A1* | 11/2020 | Kubouchi ................ H01L 29/78 |

FOREIGN PATENT DOCUMENTS

| | | |
|---|---|---|
| JP | 2015-176941 A | 10/2015 |
| JP | 2017-212407 A | 11/2017 |
| JP | 2018-10892 A | 1/2018 |
| WO | 2019/098271 A1 | 5/2019 |

* cited by examiner

NITRIDE SEMICONDUCTOR DEVICE

BACKGROUND OF THE INVENTION

Technical Field

This invention relates to a method for manufacturing a nitride semiconductor device and the nitride semiconductor device.

Background Art

In improving the device withstand voltage by way of field relaxation using guard rings, ion implantation is used to form the p-type regions that constitute the guard rings. However, in the case of gallium nitride (GaN), the formation of a p-type region by ion implantation requires an activation annealing at a relatively high temperature and decomposition may occur, making it difficult to perform. Because of this, in the case of GaN, it is difficult to form the guard rings by way of ion implantation and the field relaxation may not sufficiently be achieved.

On this issue, Patent Document 1 discloses that removing a portion of a p-type gallium nitride that has been epitaxially formed (also referred to as "p⁻ GaN" hereinafter) by etching, re-growing a n-type gallium nitride (also referred to as "n⁻ GaN" hereinafter) at a portion where the p⁻ GaN has been removed, and removing a portion of the re-grown n GaN by etching, thereby forming the guard rings.

RELATED ART DOCUMENT

Patent Document

Patent Document 1: Japanese Patent Application Laid-Open Publication No. 2015-176941

SUMMARY OF THE INVENTION

In the method disclosed in Patent Document 1, it is necessary to remove a portion of the p⁻ GaN by etching. However, it is generally difficult to control the etching amount in the depth direction (etching depth). In the method disclosed in Patent Document 1, if the etching depth is shallow, p⁻ GaN cannot be separated, and if the etching depth is too deep, the extension of the depletion region is restricted and sufficient relaxation of electric field may not occur. Furthermore, because n⁻ GaN is re-grown in the etched surface, there may be etching damages at the junction boundary between p⁻ GaN and n⁻ GaN. Therefore, a technique to form a p-type region in a gallium nitride layer with ease has been sought after.

The present invention is devised in view of the foregoing and aims to provide a method of making a nitride semiconductor device in which a p-type region is formed in a gallium nitride layer with ease, and such a nitride semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method for manufacturing a nitride semiconductor device, comprising: selectively ion-implanting an element that is other than p-type impurities and n-type impurities into a first region in a first primary surface of a gallium nitride layer so as to generate crystal defects in the first region; selectively ion-implanting a p-type impurity into a second region in the gallium nitride layer, the second region being shallower than the first region in a depth direction and being within the first region in a plan view; and thermally treating said gallium nitride layer that has been ion-implanted with said element and said p-type impurity so as to thermally diffuse said p-type impurity in the second region into a third region that is within the first region and that surrounds a bottom and sides of the second region.

In another aspect, the present disclosure provides a nitride semiconductor device, comprising: a gallium nitride layer containing nitrogen atoms, which are other than p-type impurities and n-type impurities, in a first region in a first primary surface of the gallium nitride layer, a concentration of nitrogen atoms in the first region being higher than in any other regions in the gallium nitride layer; a first p-type region containing a p-type impurity in the gallium nitride layer, the first p-type region being shallower than the first region in a depth direction and being within the first region in a plan view; and a second p-type region in the gallium nitride layer, the second p-type region having said p-type impurity at a concentration lower than a concentration of said p-type impurity in the first p-type region and surrounds a bottom and sides of the first p-type region.

In still another aspect, the present disclosure provides a nitride semiconductor device, comprising: a gallium nitride layer containing nitrogen atoms, which are other than p-type impurities and n-type impurities, in a first region in a first primary surface of the gallium nitride layer, a concentration of nitrogen atoms in the first region being higher than in any other regions in the gallium nitride layer; a first p-type region containing a p-type impurity in the gallium nitride layer, the first p-type region being shallower than the first region in a depth direction and being within the first region in a plan view; and a second p-type region in the gallium nitride layer, the second p-type region having said p-type impurity at a concentration lower than a concentration of said p-type impurity in the first p-type region and surrounds a bottom and sides of the first p-type region.

According to the present invention, a p-type region is formed in a gallium nitride layer in a nitride semiconductor device with ease.

It is to be understood that both the foregoing general description and the following detailed description are exemplary and explanatory, and are intended to provide further explanation of the invention as claimed.

DETAILED DESCRIPTION OF EMBODIMENTS

Figure 1:
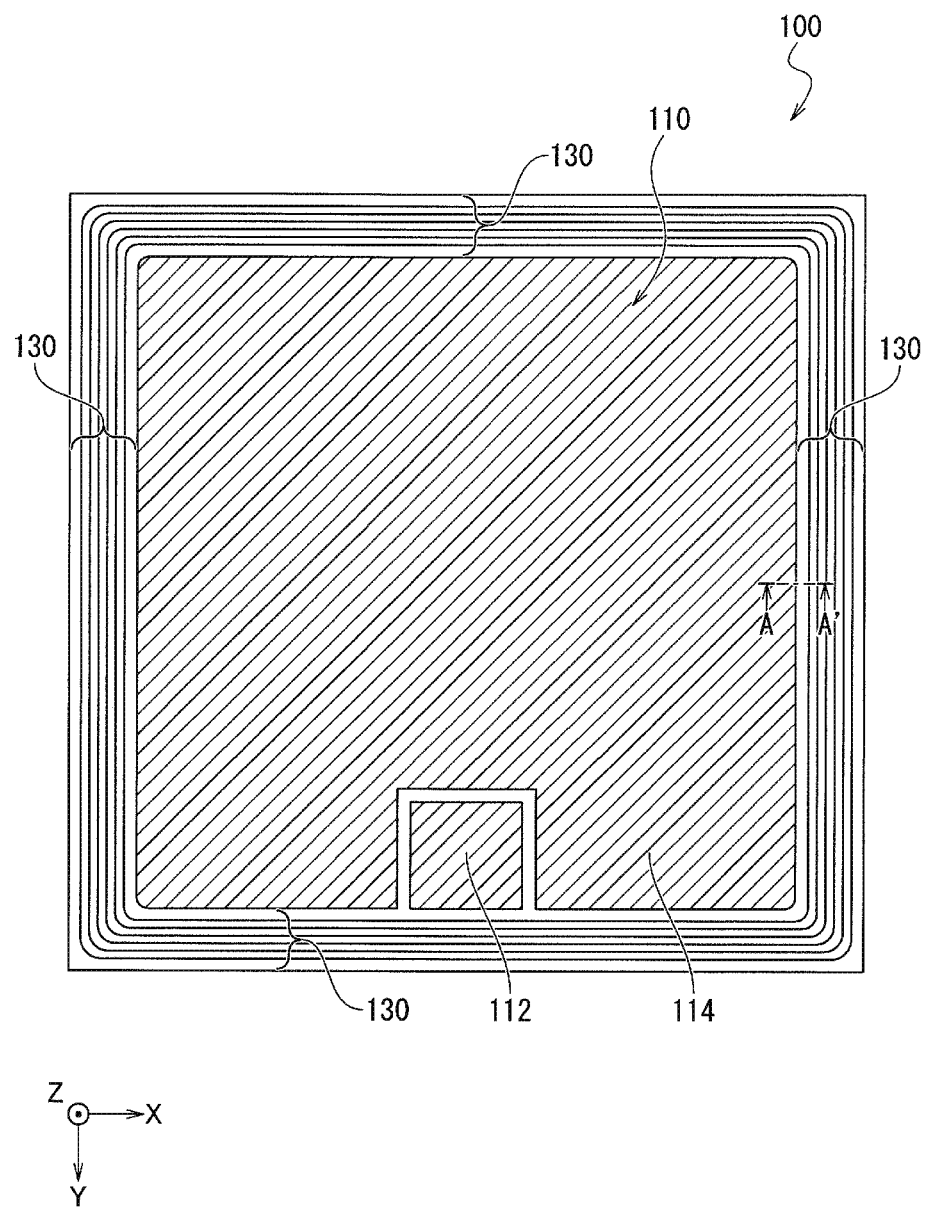
FIG. 1 is a plan view of a GaN semiconductor device according to a first embodiment of the present invention.

Various embodiments of the present invention will be described below. In the drawings and descriptions below, same or similar elements or parts are labeled by same or similar referend characters. The drawings are for illustration purposes only, and various dimensional ratios, such as relationships between the thickness and horizontal dimensions and the ratios of various dimensions of respective devices or parts, may differ from actual devices or constructions. Specific dimensions, such as thickness, etc., should be understood by referring to the corresponding descriptions below. Also, even among the drawings, the ratios of the dimensions of various parts may differ from each other.

In the descriptions below, the positive direction along the Z-axis may be referred to as "up" and the negative direction thereof may be referred to as "down." Further, "up" and "down" may not necessarily mean directions along a vertical direction with respect to the ground. That is, the directions of "up" and "down" may not be limited relative to the direction of the gravity. The expressions "up" and "down" are merely used for convenience in order to specify relative positional relationship among regions, layers, films, and substrates, etc., and do not unduly limit the scope of the present invention. For example, if a sheet is rotated 180 degrees, "top" becomes "bottom, and "bottom" becomes "top" needless to say.

Furthermore, in the below descriptions, "+" or "−" attached to p or n indicate relatively higher or lower impurity concentration as compared with p or n without these symbols. However, even if two layers have the same letter p assigned thereto, for example, that does not mean that these two layers have the exact same impurity concentrations.

First Embodiment

FIG. 1 is a plan view of a GaN semiconductor device 100 according to a first embodiment of the present invention. FIG. 1 is a X-Y plane plan view. Here, the X-axis and Y-axis directions are parallel to a first primary surface 10a of a GaN substrate 10, which will be described below. The Z-axis direction is perpendicular to the first primary surface 10a and is a direction along which a depth of GaN semiconductor device 100 is defined. The Z-axis direction is also a direction in which the depth of a gallium nitride layer 20 (GaN layer) is defined. The X-axis, the Y-axis, and the Z-axis are perpendicular to each other. The GaN semiconductor device 100 is an example of a nitride semiconductor device of the present invention.

As shown in FIG. 1, the GaN semiconductor device 100 has an active region 110 and an edge termination region 130. The active region 110 is a region in which current flows in the depth direction of the GaN semiconductor device 100 where vertical MOSFET (Metal Oxide Semiconductor Field Effect Transistor) is arranged. The active region 110 has a gate pad 112 and a source pad 114. The gate pad 112 and the source pad 114 are electrode pads that are connected to a gate electrode 62 and a source electrode 68, respectively, which are described below with reference to FIG. 2.

In a plan view, as seen in the negative Z-axis direction, the edge termination region 130 surrounds the periphery of the active region 110 and has a guard ring structure in which a plurality of thin p-type regions 40 (see FIG. 2 described below) surround the active region 110 in a ring-shaped manner. The edge termination region 130 provides a function of preventing electric field concentration (i.e., field relaxation) in the active region 110 by expanding the depletion region generated in the active region 110 to the edge termination region 130.

Figure 2:
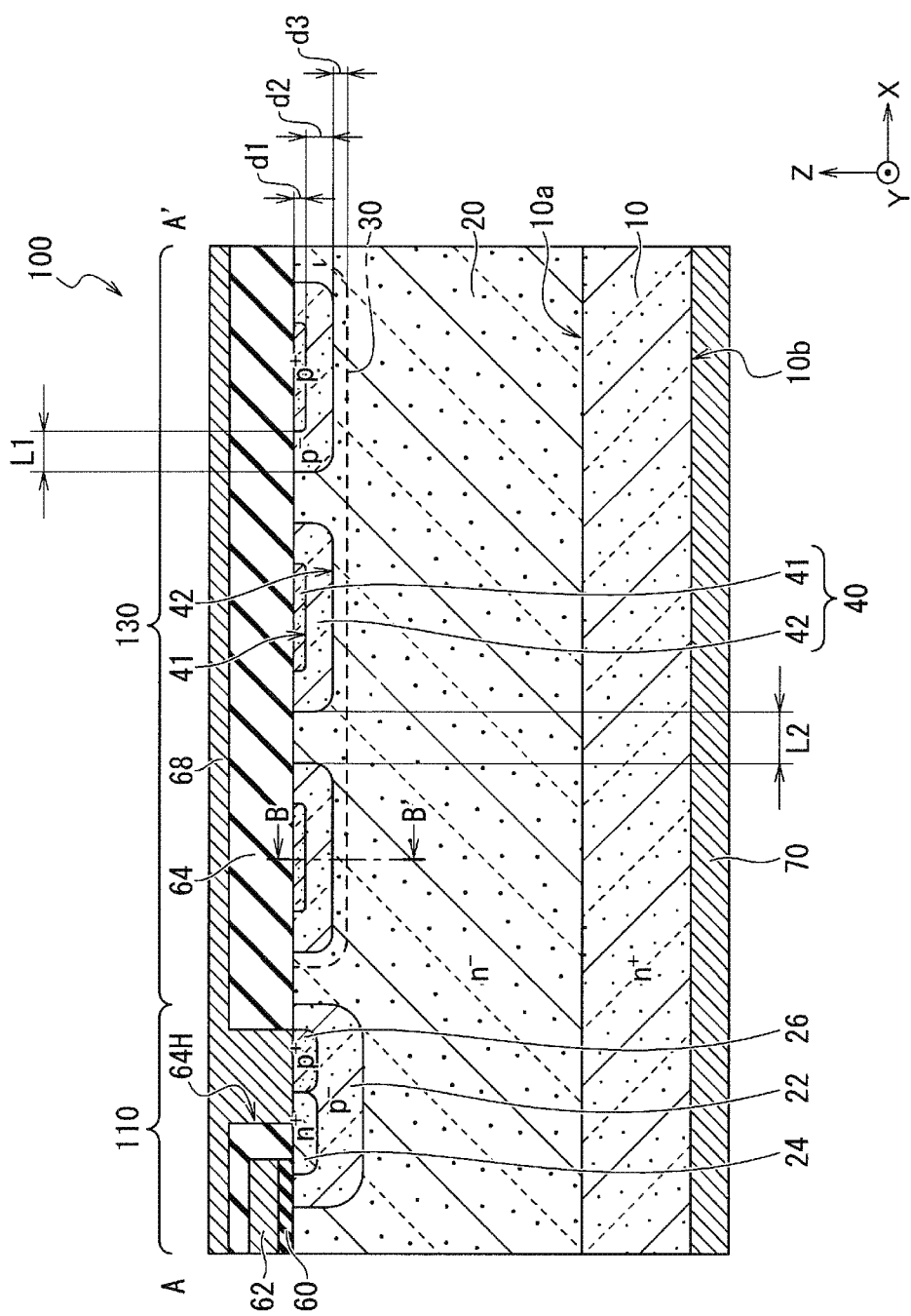
FIG. 2 is a cross-sectional view of the GaN semiconductor device according to the first embodiment of the present invention.

FIG. 2 is a cross-sectional view of the GaN semiconductor device 100 according to the first embodiment of the present invention. FIG. 2 is a cross section taken along the line A-A' of FIG. 1. As shown in FIG. 2, the GaN semiconductor device 100 has a gallium nitride substrate 10 (GaN substrate), a GaN layer 20 provided on a first primary surface 10a of the GaN substrate 10, a gate insulating film 60 provided on the GaN layer 20, a gate electrode 62 provided on the gate insulating film 60, an interlayer insulating film 64 on the GaN layer 20, covering the gate electrode 62, a source electrode 68 provided on the interlayer insulating film 64, and a drain electrode 70 provided on a second primary surface 10b of the GaN substrate 10.

The GaN substrate 10 is a GaN single crystalline substrate. The GaN substrate 10 is an n-type substrate. It may be an n+ substrate, for example. The GaN substrate 10 has the first primary surface 10a and the second primary substrate 10b that is opposite to the first primary substrate 10a. For example, the GaN substrate 10 is a self-supporting, low dislocation density substrate having a dislocation density less than $1.0 \times 10^7$ cm$^{-2}$. Due to the low dislocation density of the GaN substrate 10, the dislocation density of the GaN layer 20 formed on the GaN substrate 10 becomes low as well.

By using the GaN substrate 10 having such a low dislocation density, even when a large area power device is formed on the GaN substrate 10, the device has a small leakage current. Because of this, the power devices can be manufactured at a high yield. Moreover, a thermal treatment can prevent undesirable deep diffusion of ion-implanted impurities along dislocations.

The GaN layer 20 is epitaxially formed on the first primary surface 10a of the GaN substrate 10. The GaN layer 20 is an n type layer, and may be an n+ layer, for example. The n-type impurities in the GaN layer 20 may be silicon (Si), germanium (Ge) or oxygen (O) or their combinations. In this embodiment, Si is used as an example of the n-type impurity.

In the GaN layer 20, the donor concentration Nd obtained by offsetting the n-type impurity concentration with compensating impurity concentrations is equal to or greater than $1.0 \times 10^{15}$ cm$^{-3}$ and less than or equal to $5.0 \times 10^{16}$ cm$^{-3}$, for example. It may be $1.0 \times 10^{16}$ cm$^{-3}$, for example. The compensating impurity may be carbon (C), for example. The thickness of the GaN layer 20 (i.e., the distance from the primary surface 10a of the GaN substrate 10 to the surface 20a of the GaN layer 20) is equal to or greater than 1 μm and less than or equal to 50 μm, for example. It may be 10 μm, for example. The surface 20a of the GaN layer 20 is an example of the "first primary surface) of the present disclosure.

The gate insulating film 60 is made of silicon oxide (SiO$_2$ film), for example. The gate electrode 62 is made of polysilicon (Poly-Si) doped with impurities. The interlayer insulating film 64 is made of SiO$_2$, for example. The thickness of the interlayer insulating film 64 is equal to or greater than 0.5 μm and less than or equal to 1 μm, for example.

The source electrode 68 is in contact with a source region 24 and a contact region 26 through the contact hole 64H formed in the interlayer insulating film 64. The source electrode 68 is made of a Ti layer at the contacting surface and Al or Al alloy (for example, Al—Si, which is an alloy of Al and Si) at the other portions. The source electrode 68 may also function as the source pad 114 (FIG. 1). The drain electrode 70 is in contact with the second primary surface 10b of the GaN substrate 10. The drain electrode 70 is made of a Ti layer at the contacting surface and Al or Al alloy (for example, Al—Si, which is an alloy of Al and Si) at the other portions.

In the GaN layer 20 in the active region 110, a p$^-$ well region 22, an n$^+$ source region 24, and a p$^+$ contact region 26 are provided. The well region 22 is formed on a surface side of the GaN layer 20. A channel of the MOSFET is formed in a region at and adjacent to the surface of the well region 22 that is directly under the gate electrode 62 through the gate insulating film 60. The source region 24 and the contact region 26 are arranged inside of the well region 22. The source region 24 and the contact region 26 contact with each other.

In the GaN layer 20 in the edge termination region 130, an N injected region 30 ("defect region" or "element high density region") and p-type regions 40 within the N injected region 30 are provided. The p-type region 40 includes an Mg injected region 41 ("first p-type region") and an Mg diffused region 42 ("second p-type region") at the periphery of the Mg injected region 41.

The N injected region 30 is a region in which nitrogen (N) atoms are injected by ion implantation. The concentration of nitrogen in the N injected region 30 is higher than that in a region surrounding the N injected region 30. The nitrogen concentration in the N injected region 30 is equal to or greater than $1.0 \times 10^{18}$ cm$^{-3}$ and less than or equal to $1.0 \times 10^{19}$ cm$^{-3}$, for example. The nitrogen here is an example of "an impurity other than p-type impurities and n-type impurities."

The Mg injected region 41 is a region in which magnesium (Mg) is injected by ion implantation. The Mg concentration in the Mg injected region 41 is higher than that in a region surrounding the Mg injected region 41.

The Mg diffused region is a region in which Mg injected in the Mg injected region 41 is thermally diffused. The Mg concentration in the Mg diffused region is higher than that in the N injected region and is lower than that in the Mg injected region 41.

Figure 3:
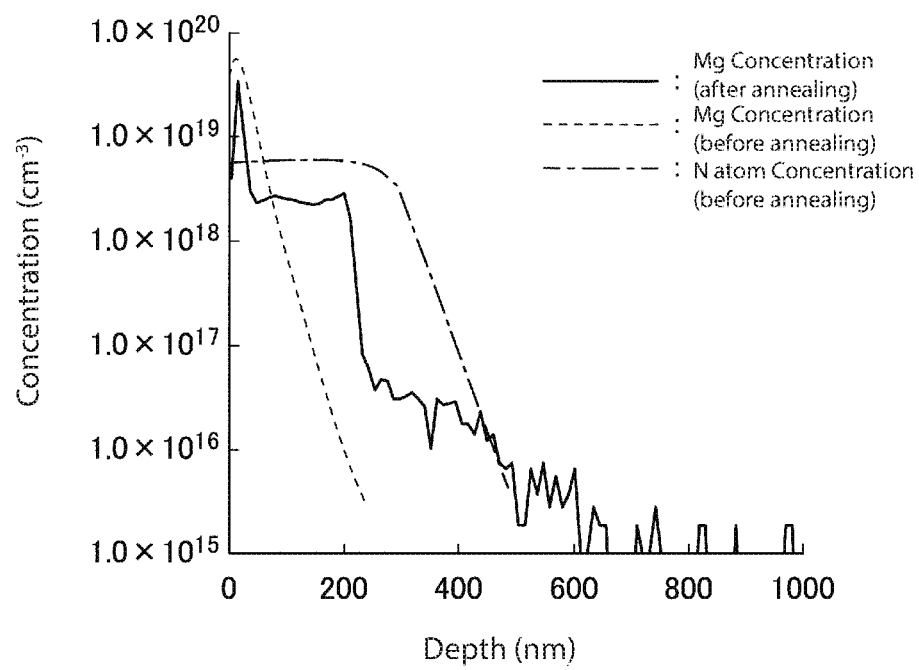
FIG. 3 is an exemplary depth profile of the Mg concentrations in the GaN semiconductor device according to the first embodiment of the present invention.

FIG. 3 is an exemplary depth profile of the Mg concentration in the GaN semiconductor device 100 according to the first embodiment of the present invention. In FIG. 3, the horizontal axis shows a depth from the surface 20a of the GaN layer 20 in the unite of nm, and the vertical axis shows concentrations of elements contained in the GaN layer 20 in the unit of cm$^{-3}$. FIG. 3 shows Mg concentrations along the line B-B' of FIG. 2 As shown in FIG. 3, the Mg concentration in the Mg diffused region 42 is roughly constant in the depth direction; in this example, it is roughly constant in a range equal to or greater than $1.0 \times 10^{18}$ cm$^{-3}$ and less than or equal to $1.0 \times 10^{19}$ cm$^{-3}$. Furthermore, in the depth direction of the GaN layer 20, the Mg concentration drastically changes at the boundary between the Mg injected region 41 and the Mg diffused region 42 and at the boundary between the Mg diffused region 42 and the N injected region 30.

Here, in FIG. 3, the broken line indicates the Mg concentration immediately after the ion implantation, and the dash-dot line indicates the N concentration immediately after the ion implantation. The Mg concentration indicated by the broken line and the N concentration indicated by the dash-dot line will be explained below.

Figure 4:
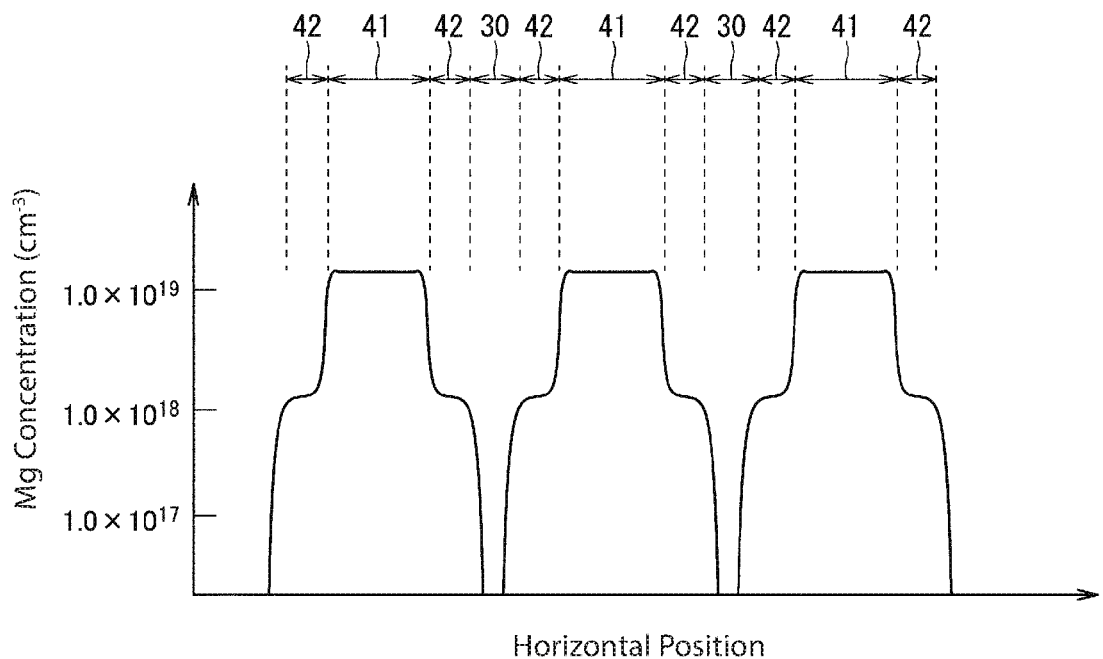
FIG. 4 is an exemplary Mg concentration profile in the vicinity of the surface in the horizontal direction in the GaN semiconductor device according to the first embodiment of the present invention.

FIG. 4 is an exemplary Mg concentration distribution in the vicinity of the surface 20a of the GaN layer 20 in the horizontal direction in the GaN semiconductor device 100 according to the first embodiment of the present invention. In FIG. 4, the horizontal axis shows horizontal positions in the GaN layer 20, and the vertical axis shows the Mg concentration (cm$^{-3}$). As shown in FIG. 4, the Mg concentration in the Mg diffused region 42 is roughly constant along the horizontal direction of the GaN layer 20. The Mg concentration drastically changes at the boundaries between the Mg injected region 41 and the Mg diffused region 42 and at the boundaries between the Mg diffused region 42 and the N injected region 30.

The distance d1 shown in FIG. 2, which is the distance from the surface 20a of the GaN layer 20 to the bottom of the Mg injected region 41 (i.e., the thickness of the Mg injected region 41), is equal to or greater than 10 nm and less than or equal to 100 nm, for example. The distance d2, which is the distance from the bottom of the Mg injected region 41 to the bottom of the Mg diffused region 42 (i.e., the thickness of the Mg diffused region directly under the Mg injected region 41) is equal to or greater than 100 nm and less than or equal to 1000 nm, for example. The distance d3, which is the distance from the bottom of the Mg diffused region 42 to the bottom of the N injected region 30 (i.e., the thickness of the N injected region 30 directly under the Mg diffused region 42) is equal to or greater than 50 nm and less than or equal to 500 nm, for example.

The length L1 shown in FIG. 2, which is the length of the Mg diffused region 42 at the surface 20a of the GaN layer 20 (i.e., the diffusion length of Mg in the Mg injected region 41 in the horizontal direction) is equal to or greater than 100 nm and less than or equal to 1000 nm, for example. The horizontal direction here is a direction in the X-Y plane and perpendicular to the Z-axis. The interval L2, which is the spacing between the adjacent two Mg diffused regions 42 at the surface 20a of the GaN layer 20, is equal to or greater than 0.2 μm and less than or equal to 1 μm, for example.

The guard ring structure in the edge termination region 130 includes a plurality of p-type regions 40 each having the Mg injected region 41 and the Mg diffused region 42. With the plurality of p-type regions 40 surrounding the active region 110 in ring shapes, the electric field at the periphery of the active region 110 is relaxed, thereby ensuring the high withstand voltage of the GaN semiconductor device 100. To enhance the field relaxation function by the guard ring structure, the Mg injected region 41 and the Mg diffused region 42, which constitute the p-type region 40, are preferably designed as follows.

The Mg concentration in the Mg injected region 41 in the vicinity of the surface 20a preferably is equal to or greater than $1.0 \times 10^{19}$ cm$^{-3}$. The Mg concentration in the Mg diffused region 42 preferably is equal to or greater than $1.0 \times 10^{17}$ cm$^{-3}$ and less than or equal to $1.0 \times 10^{19}$ cm$^{-3}$, and more preferably is equal to or greater than $1.0 \times 10^{18}$ cm$^{-3}$ and less than or equal to $1.0 \times 10^{19}$ cm$^{-3}$.

The Mg diffused region 42 preferably has a width of 100 nm or greater in the depth and horizontal directions at the periphery of the Mg diffused region 41. That is, the above-mentioned distances d2 and L1 are both preferably equal to or greater than 100 nm.

Further, the width of a region between the Mg diffused region 42 and the N injected region 30, in which the Mg concentration changes from greater than or equal to $1.0 \times 10^{18}$ cm$^{-3}$ to equal to or less than $1.0 \times 10^{17}$ cm$^{-3}$ (i.e., the Mg concentration decreases to $1/10^{th}$ or less), is preferably equal to or less than 100 nm, and more preferably is equal to or less than 50 nm.

The p-type region 40, which is constructed of the Mg injected region 41 and the Mg diffused region 42, is preferably provided in a plurality and repeatedly arranged in the horizontal direction. The interval L2 between the Mg diffused regions 42 is preferably 1 μm or less, and more preferably 0.5 μm or less. The number of the p-type regions 40 and the distance L2 may be appropriately designed in accordance with the target withstand voltage required for the guard ring structure.

<Manufacturing Method for GaN Semiconductor Device>

A manufacturing method for the GaN semiconductor device 100 according to an embodiment of the present invention will be described. FIGS. 5 to 10 are cross-sectional views for explaining various steps in the manufacturing method of the GaN semiconductor device 100 of the first embodiment in the order they are performed. The GaN semiconductor device 100 is manufactured by various manufacturing apparatus, such as film formation apparatus, exposure apparatus, etching apparatus, ion-implantation apparatus, and thermal treatment apparatus.

Figure 5:
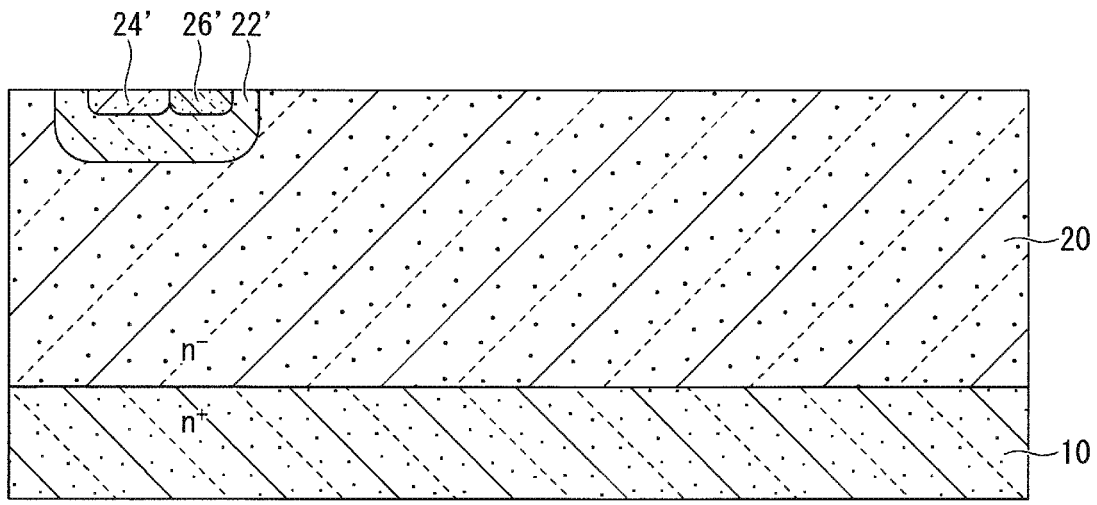
FIG. 5 is a cross-sectional view showing a step in a manufacturing method of the GaN semiconductor device according to the first embodiment of the present invention.

As shown in FIG. 5, the GaN layer 20 is formed on the GaN substrate 10. For example, an n GaN layer 20 is epitaxially grown on an n$^+$ GaN substrate 10 using an apparatus for Metal Organic Chemical Vapor Deposition (MOCVD), Halide Vapor Phase Epitaxy (HVPE) or the like.

Next, Mg and Si are locally injected into the GaN layer 20 in the active region 110 (see FIG. 2) by photolithography and ion-implantation. For example, Mg is ion-implanted into a region 22', which will become the p$^-$ well region 22 (see FIG. 2). Si is ion-implanted into a region 24', which will become the n$^+$ source region 24 (see FIG. 2). Mg is ion-implanted into a region 26', which will become the p$^+$ contact region 26 (see FIG. 2). The order for the respective ion-implantation processes for the respective ions for the regions 22', 24' and 26' is not particularly limited, and these ion-implantation processes may be performed in any order.

Figure 6:
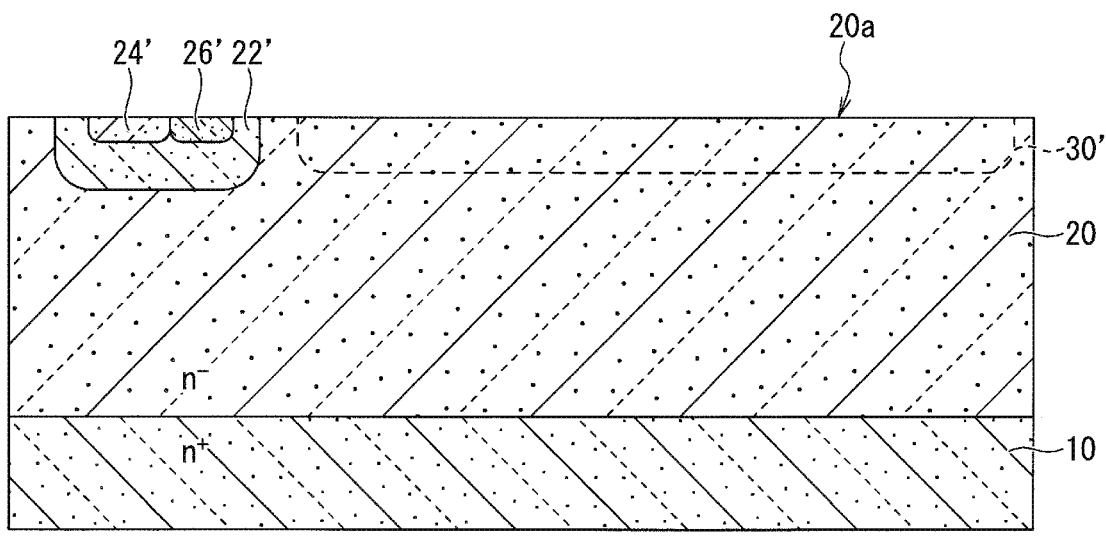
FIG. 6 is a cross-sectional view showing a step in a manufacturing method of the GaN semiconductor device according to the first embodiment of the present invention.

Next, as shown in FIG. 6, nitrogen (N) is locally ion-implanted into the GaN layer 20 in the edge termination region 130 (see FIG. 2) by photolithography and ion implantation. Here, the N atoms are ion-implanted into a region 30'(an example of the "first region"), which becomes the N injected region 30. In the N ion implantation process, multiple ion implantations with varying implantation energies and injection amounts may be performed so that the injected N concentration is roughly constant from the surface 20a of the GaN layer 20 up to a depth of 300 nm, for example, as shown in the dash-dot line in FIG. 3. By the N ion implantation, crystal defects are introduced into the region 30'.

Figure 7:
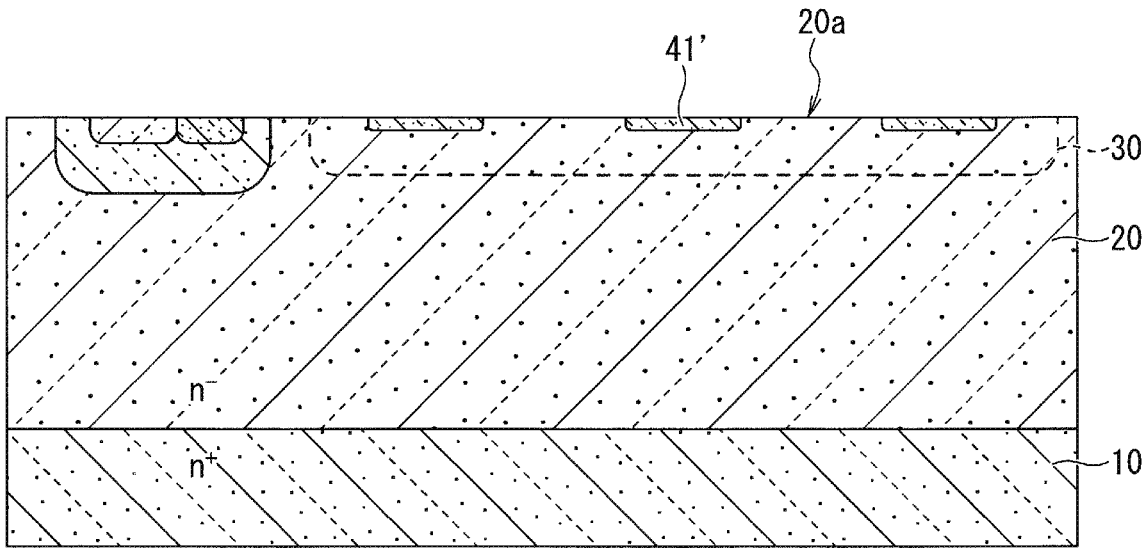
FIG. 7 is a cross-sectional view showing a step in a manufacturing method of the GaN semiconductor device according to the first embodiment of the present invention.

Next, as shown in FIG. 7, Mg is locally injected into the GaN layer 20 in the edge termination region 130 (see FIG. 2) by photolithography and ion implantation. Here, Mg is injected in to a region(s) 41' (an example of the "second region"), which will become the Mg injected region(s) 41. In the Mg ion implantation process, as indicated by the dotted line in FIG. 3, the implantation energy is set such that the injection peak of Mg is located sufficiently shallower than the injection depth of N atoms (which is, for example, a depth of 300 nm from the surface 20a of the GaN layer 20). The injection peak of Mg is formed between the surface 20a of the GaN layer 20 and the deepest injection peak of N atoms.

That is, the Mg implantation energy is set such that the Mg injection peak is located within the N injected region. Also, it is preferable to set the Mg implantation energy such that the Mg injection peak is located at a position close to the surface 20a of the GaN layer 20. This way, the distance d2 shown in FIG. 2 can be made large.

Here, the order of the above-mentioned N ion implantation process for the region 30' and the above-mentioned Mg ion implantation process for the region 41' is not limited and they may be performed in any order. The Mg ion implantation may be performed after the N ion implantation, or the N ion implantation may be performed after the Mg ion implantation.

Figure 8:
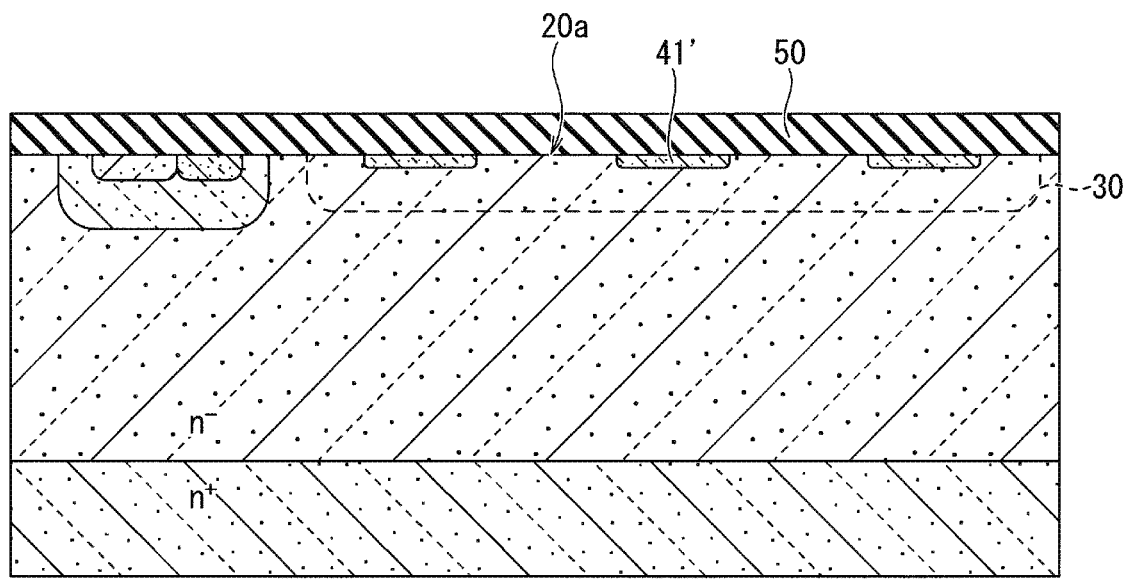
FIG. 8 is a cross-sectional view showing a step in a manufacturing method of the GaN semiconductor device according to the first embodiment of the present invention.

Next, as shown in FIG. 8, a passivation film 50 is formed on the GaN layer 20. The passivation film 50 prevents Si, Mg, and N atoms from discharging from the GaN layer 20. At sites from which N atoms are discharged will form nitrogen vacancies. Because the nitrogen vacancies could function as donor defects, the realization of p-type property may be inhibited by them. To prevent this, the passivation film 50 is formed on the GaN layer 20. Here, the passivation film 50 may be formed on an insulating film (not shown in the figure) previously formed on the GaN layer 20. Furthermore, the passivation film 50 may be formed not only on the GaN layer 20, but also on a side of the second primary surface 10b of the GaN substrate 10.

The passivation film 50 preferably has properties of a high thermal resistance and a high adhesiveness with an insulating film, and should not allow its impurities to diffuse into the GaN layer 20 side. The passivation film 50 in the GaN layer 20 also preferably has an etching selectivity with respect to the GaN layer 20. The passivation film 50 may be an aluminum nitride (AlN) film, an SiO$_2$ film, or a silicon nitride (SiN) film. For example, it is an AlN film with a thickness of 300 nm.

Figure 9:
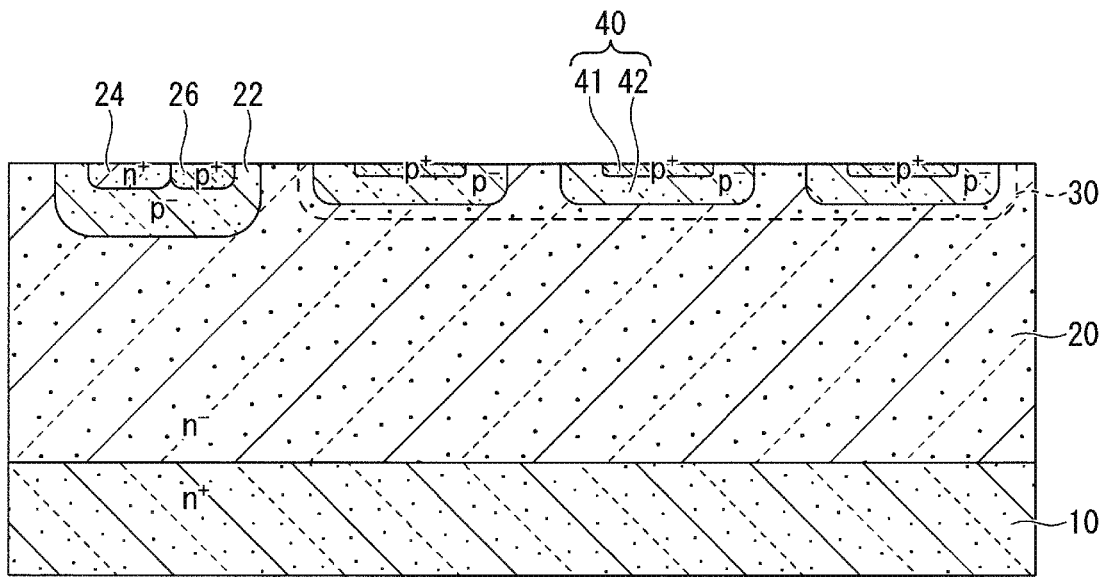
FIG. 9 is a cross-sectional view showing a step in a manufacturing method of the GaN semiconductor device according to the first embodiment of the present invention.

Next, a thermal treatment is performed on a multilayered boy that includes the GaN substrate 10 and the GaN layer 20. The conditions for the terminal treatment are, for example, in a nitrogen atmosphere, at 1300° C., for 5 minutes. Due to this thermal treatment, Si and Mg that have been ion-implanted into the GaN layer 20 are activated. As a result, as shown in FIG. 9, the p⁻ well region 22, the n⁺ source region 24, the p⁺ contact region 26, the N injected region 30, the Mg injected regions 41, and the Mg diffused regions 42 are formed in the GaN layer 20. The Mg diffused regions 42 are formed by activation of Mg that has been thermally diffused from the Mg injected region 41 into the region 30' that have crystal defects due to the N ion implantation.

Figure 10:
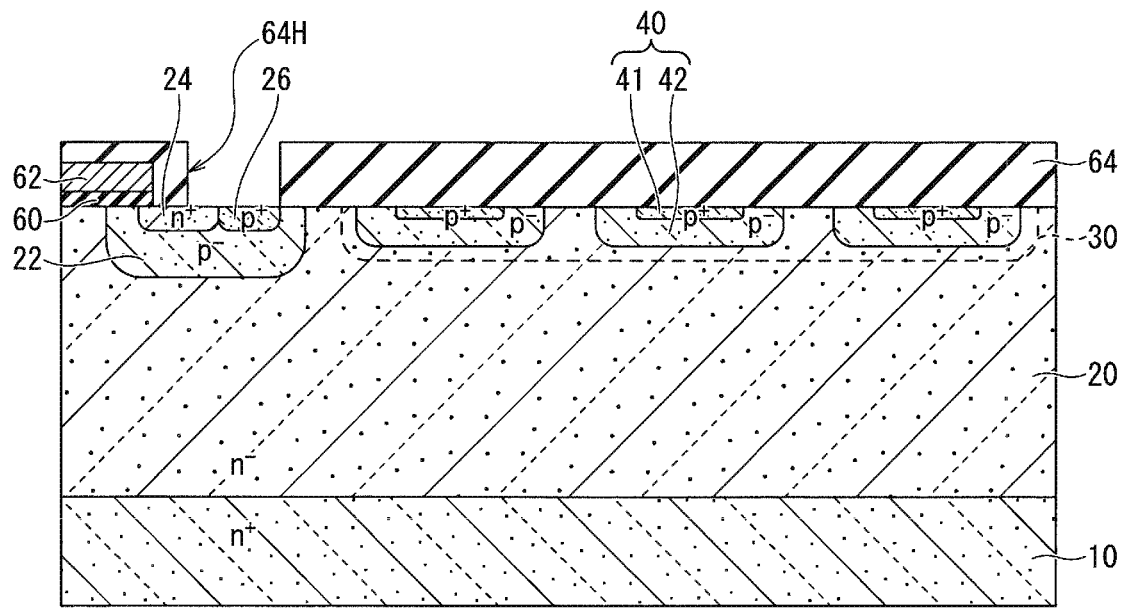
FIG. 10 is a cross-sectional view showing a step in a manufacturing method of the GaN semiconductor device according to the first embodiment of the present invention.

Next, the passivation film 50 is removed from the GaN layer 20, as shown in FIG. 9. As shown in FIG. 10, next, a gate insulating film 60, a gate electrode 62, an interlayer insulating film 64, and a contact hole 64H are formed on the GaN layer 20. Next, a source electrode 68 (see FIG. 2) is formed to fill in the contact hole 64H. Through these manufacturing steps, the GaN semiconductor device 100, as shown in FIG. 2, is completed.

As explained above, the manufacturing method for the GaN semiconductor device 100 according to the first embodiment includes: ion-implanting nitrogen atoms (N) in a region 30' that is locally positioned on a side of the surface 20a of the GaN layer 20; ion-implanting magnesium (Mg), which is an example of p-type impurities, into a region 41' that is locally positioned in the region 30' that has been N ion-implanted; and performing a thermal treatment on the GaN layer 20, which has been N and Mg ion-implanted. In the thermal treatment process, Mg is thermally diffused from the region 41' that has been ion implanted with Mg into a region 42', which is within the N ion-implanted region 30' and which surrounds the region 41'.

According to the manufacturing method of the first embodiment, the region 30', which is locally positioned on the side of the surface 20a of the GaN layer 20, contains a high concentration of crystal defects due to the N ion implantation, as compared with other regions of the GaN layer 20. Mg is ion-implanted into this high defect density region and the ion-implanted Mg is thermally diffused by a thermal treatment. Mg diffuses more in GaN having crystal defects than in GaN having no or less crystal defects. Because of this, Mg that has been introduced into the region 41' thermally diffuses into the region 42' in a relative short amount of time at a relatively low temperature. As a result, the p⁺ Mg injected region 41 and the p Mg diffused region 42 are formed in the n⁻ GaN layer 20 with ease.

Further, according to the manufacturing method of the first embodiment, the p-type region 40 (the p⁺ Mg injected region 41 and the p Mg diffused region 42) is locally formed without using etching steps. Because there is no need to perform etching on the GaN layer 20 in the formation of the p-type region 40, the pn junction between the n⁻ GaN layer 20 and the p-type region 40 does not suffer etching damages. Due to this, in the guard ring structure that includes the p-type regions 40, instabilities on various properties, such as the withstand voltage, due to etching damages can be prevented.

Further, according to the manufacturing method of the first embodiment, the p-type regions 40 can be locally formed in the n⁻ GaN layer 20 without re-growing p⁻ GaN on the n GaN. Because there is no need to re-grow p⁻ GaN in the formation of the p-type region 40, silicon (Si) and oxygen (O) do not exist at high concentrations at the pn junction between the n⁻ GaN layer 20 and the p-type region 40. Silicon (Si) and Oxygen (O) function as n-type impurities in GaN. Because a high-density n-type impurity region is not formed at the above-mentioned pn junction, the guard ring structure that includes the p-type regions 40 can effectively prevent instabilities on various properties, such as the withstand voltage, due to high-density n-type impurities.

In the manufacturing method of the first embodiment, the Mg concentrations in the p-type region 40 can be adjusted by appropriately setting the Mg ion implantation conditions (the Mg dosage and Mg ion implantation energy, for example), the thermal treatment conditions (the thermal treatment temperature and duration, for example), and the N ion implantation conditions (the N dosage and N ion implantation energy, for example). For example, in the p-type region 40, the Mg injected region 41 having an Mg concentration of equal to or greater than $1.0 \times 10^{19}$ cm⁻³ and less than or equal to $1.0 \times 10^{20}$ cm⁻³ and the Mg diffused region 42 having an Mg concentration of equal to or greater than $1.0 \times 10^{17}$ cm⁻³ and less than or equal to $1.0 \times 10^{19}$ cm⁻³ may be formed.

Furthermore, as shown in FIG. 3, the Mg concentration in the Mg diffused region 42 may be made constant at about $1 \times 10^{18}$ cm⁻³ along the depth direction and may be made to change drastically along the depth direction at and near the boundary with the n⁻ GaN layer 20. For example, in the depth direction of GaN layer 20 (Z-axis direction), the width of a region within which the Mg concentration decreases by $\frac{1}{10}^{th}$ (to about $1.0 \times 10^{17}$ cm⁻³) of the Mg concentration in the Mg diffused region 42, as moving farther away from the Mg diffused region 42 in the depth direction, may be made equal to or less than 100 nm.

Figure 11:
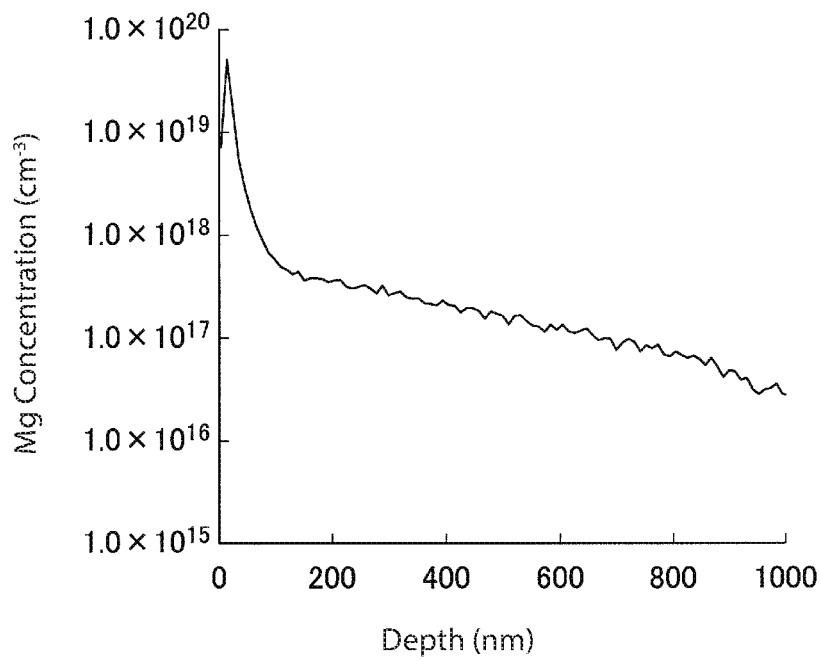
FIG. 11 is a depth profile of the Mg concentrations in a comparison example.

FIG. 11 is a depth profile of the Mg concentrations in a comparison example. In FIG. 11, the horizontal axis shows the depth (nm) from the surface of GaN, and the vertical axis shows the Mg concentration contained in GaN in cm⁻³. In this comparison example, nitrogen atoms are not ion-implanted in GaN. In this comparison example shown in FIG. 11, Mg was ion-implanted into GaN and the thermal treatment was conducted under the same conditions as those for the first embodiment for which data for FIG. 3 were taken, but the N ion implantation was not conducted. FIG. 11 shows that in the comparison example, the Mg concentration in the Mg diffused region cannot be made constant at around $1 \times 10^{18}$ cm⁻³.

The GaN semiconductor device 100 according to the first embodiment of the present invention includes: the N injected region 30 provided locally on a side of the surfaced 20a of the GaN layer 20 and the p-type region 40 provided locally within the N injected region 30. The N injected region 30 contains a higher concentration of nitrogen atoms than in other regions within the GaN layer 20 and contains crystal defects that are generated due to the nitrogen atoms ion implantation. The p-type region 40 includes the Mg injected region 41 that contains Mg and the Mg diffused region 42 that surrounds the Mg injected region 41 and contains Mg at a lesser concentration than in the Mg injected region 41. For example, the Mg diffused region 42 is in contact with the sides of the Mg injected region 41 in the X and Y directions and also in contact with the bottom of the Mg injected region 41 in the Z direction.

The manufacturing method of the first embodiment therefore can manufacture the GaN semiconductor device 100 having this structure.

Modified Example

Figure 12:
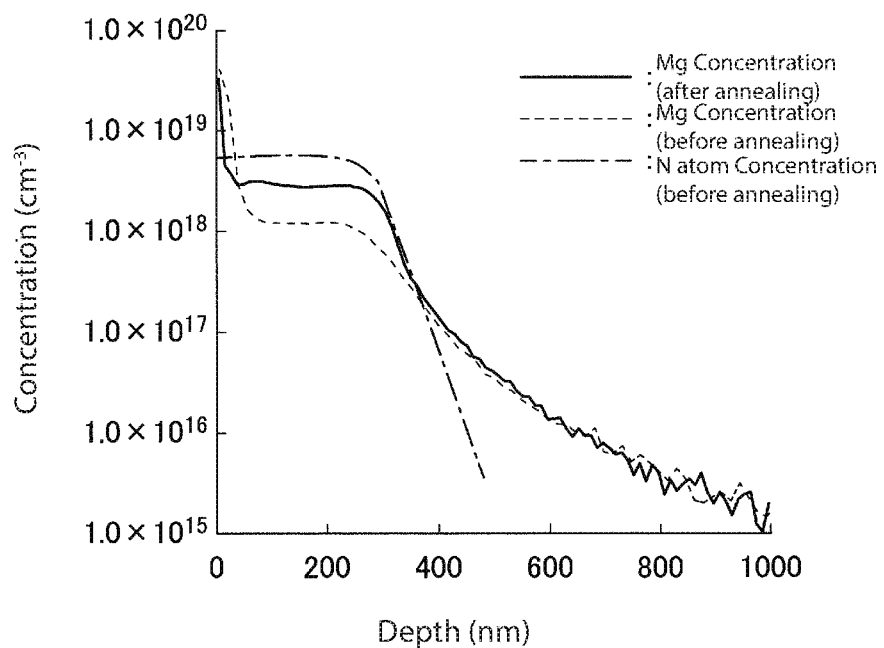
FIG. 12 is a depth profile of the Mg concentrations in a GaN semiconductor device according to a modified example of the first embodiment of the present invention.

FIG. 12 is a depth profile of the Mg concentrations in a GaN semiconductor device according to a modified example of the first embodiment of the present invention. In FIG. 12, the horizontal axis shows the depth (nm) from the surface 20a of the GaN layer 20, and the vertical axis shows the concentrations of elements contained in the GaN layer 20 in cm$^{-3}$. In FIG. 12, the broken line indicates the Mg concentration profile immediately after the ion implantation, and the dash-dot line indicates the N concentration profile immediately after the ion implantation.

The Mg ion implantation performed in FIG. 7 for the first embodiment may be performed multiple times by varying the Mg implantation energy. By doing so, the Mg concentration profile immediately after the ion implantation may differ from the profile shown in FIG. 3. For example, the Mg concentration immediately after the ion implantation may be made roughly constant in the depth range of 100 nm to 250 nm from the surface 20a of the GaN layer 20. In this case, as shown by the solid line in FIG. 12, the Mg concentration after the thermal treatment takes a shape different from the shape in FIG. 3. For example, the Mg concentration after the thermal treatment may be made roughly constant in the depth range of 100 nm to 250 nm from the surface 20a of the GaN layer 20. Similar to the first embodiment above, the p$^+$ Mg injected region 41 and the p Mg diffused region 42 having this profile may be formed in the n$^-$ Gan layer 20 with ease.

Here, the p-type region 40 having the concentration profile of FIG. 3 and the p-type region 40 having the concentration profile of FIG. 12 may be formed in the same substrate. In such a case, both types of the p-type regions may be formed via the same thermal treatment process.

In the embodiments above, as the "element other than p-type impurities and n-type impurities," nitrogen (N) atoms are used. However, the present invention is not limited thereto. For example, elements other than N, such as phosphorous (P) and arsenic (As), may be used as the "element other than p-type impurities and n-type impurities," to introduce crystal defects in the GaN layer 20.

Second Embodiment

Figure 13:
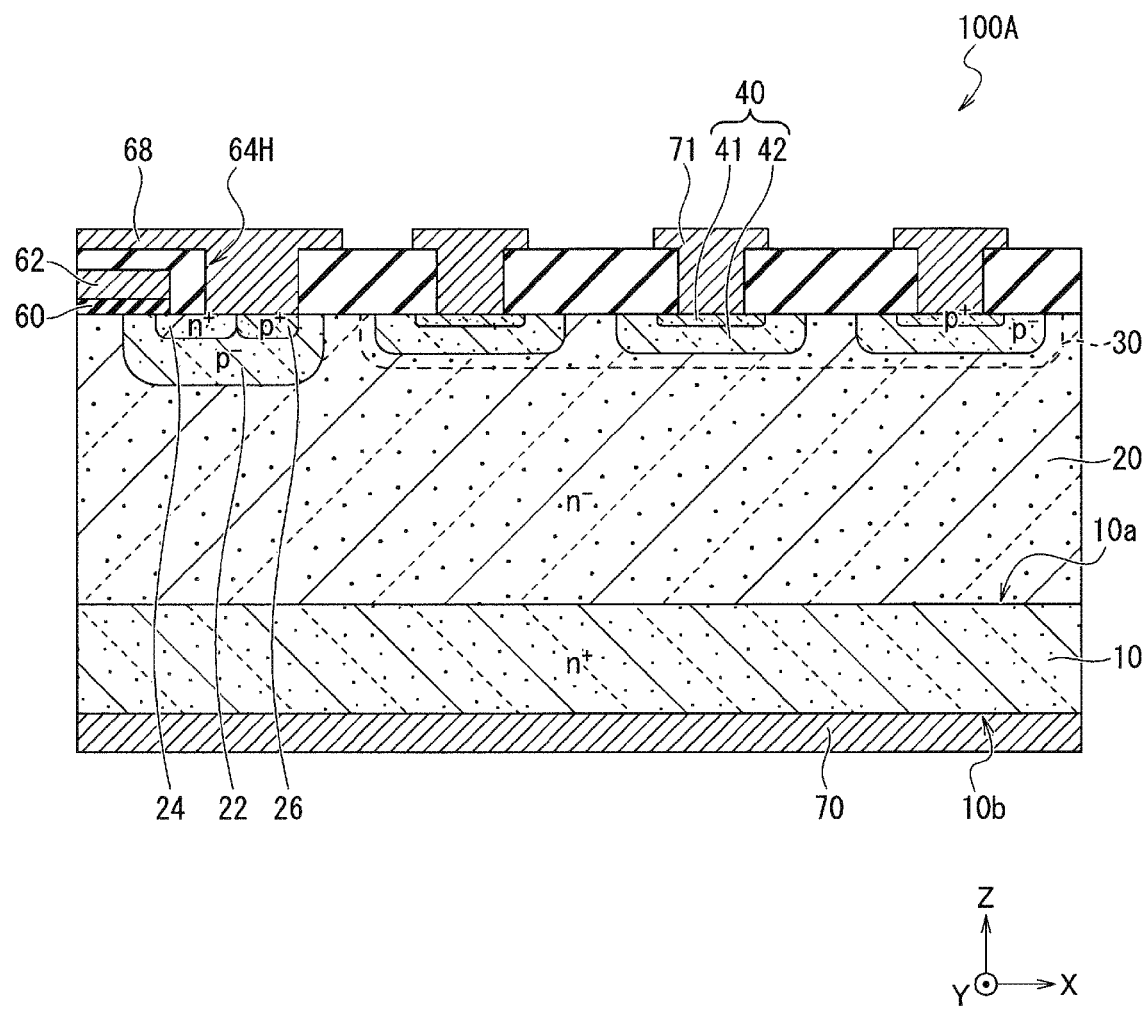
FIG. 13 is a cross-sectional view of a GaN semiconductor device according to a second embodiment of the present invention.

FIG. 13 is a cross-sectional view of a GaN semiconductor device 100A according to a second embodiment of the present invention (another example of the "nitride semiconductor device" of the present invention). As shown in FIG. 13, the GaN semiconductor device 100A has electrodes 71 connected to the Mg injected regions 41. The electrodes 71 are independent electrodes electrically isolated from the gate electrode 62, the source electrode 68, the gate pad 112, and the source pad 114, provided in the active region 110.

This structure also provides the same effects as the first embodiment. Further, in the GaN semiconductor device 100A, voltages may be applied to the p-type regions 40 through the electrodes 71. Because of this, the depletion region can further expand from the p-type regions 40 towards the n$^-$ GaN layer 20, thereby improving the withstand voltage of the GaN semiconductor device 100A.

Third Embodiment

Figure 14:
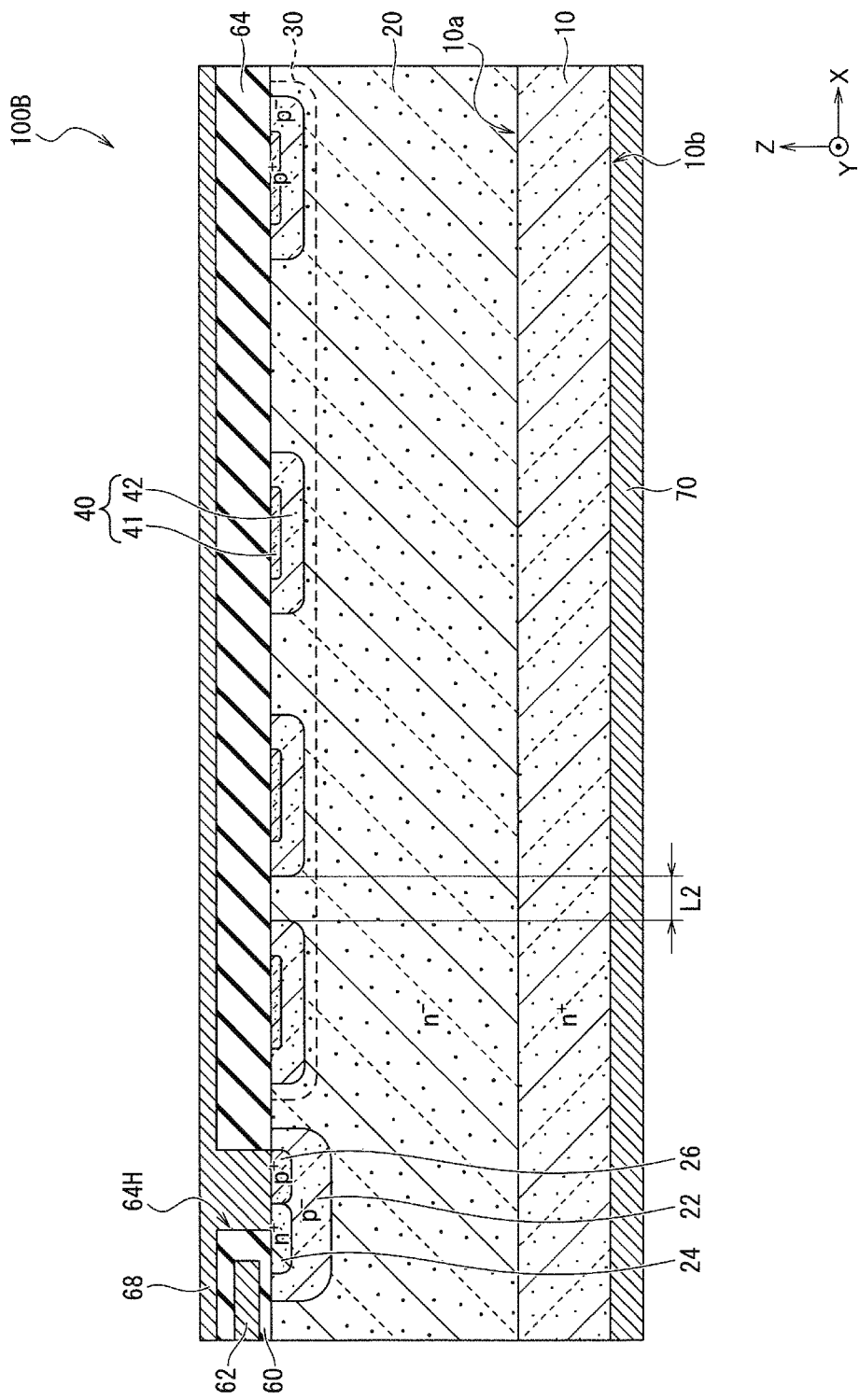
FIG. 14 is a cross-sectional view of a GaN semiconductor device according to a third embodiment of the present invention.

FIG. 14 is a cross-sectional view of a GaN semiconductor device 100B according to a third embodiment of the present invention. The GaN semiconductor device 100B is an example of the "nitride semiconductor device" of the present invention. As shown in FIG. 14, in the GaN semiconductor device 100B, the horizontal intervals L2 of a plurality of p-type regions 40 that constitute a guard ring structure are progressively widened from the active region 110 side towards the periphery of the edge termination region 130.

For example, the interval L2 near the active region 110 is 1 µm or less, and L2 becomes progressively larger than 1 µm as moving towards the periphery of the edge termination region 130.

This structure has the same effects as the first embodiment. Further, in the GaN semiconductor device 100B, the lengths of the intervals L2 and their variations may be adjusted according to the required withstand voltage. This will further contribute to an improvement of the withstand voltage of the GaN semiconductor device 100B.

Fourth Embodiment

Figure 15:
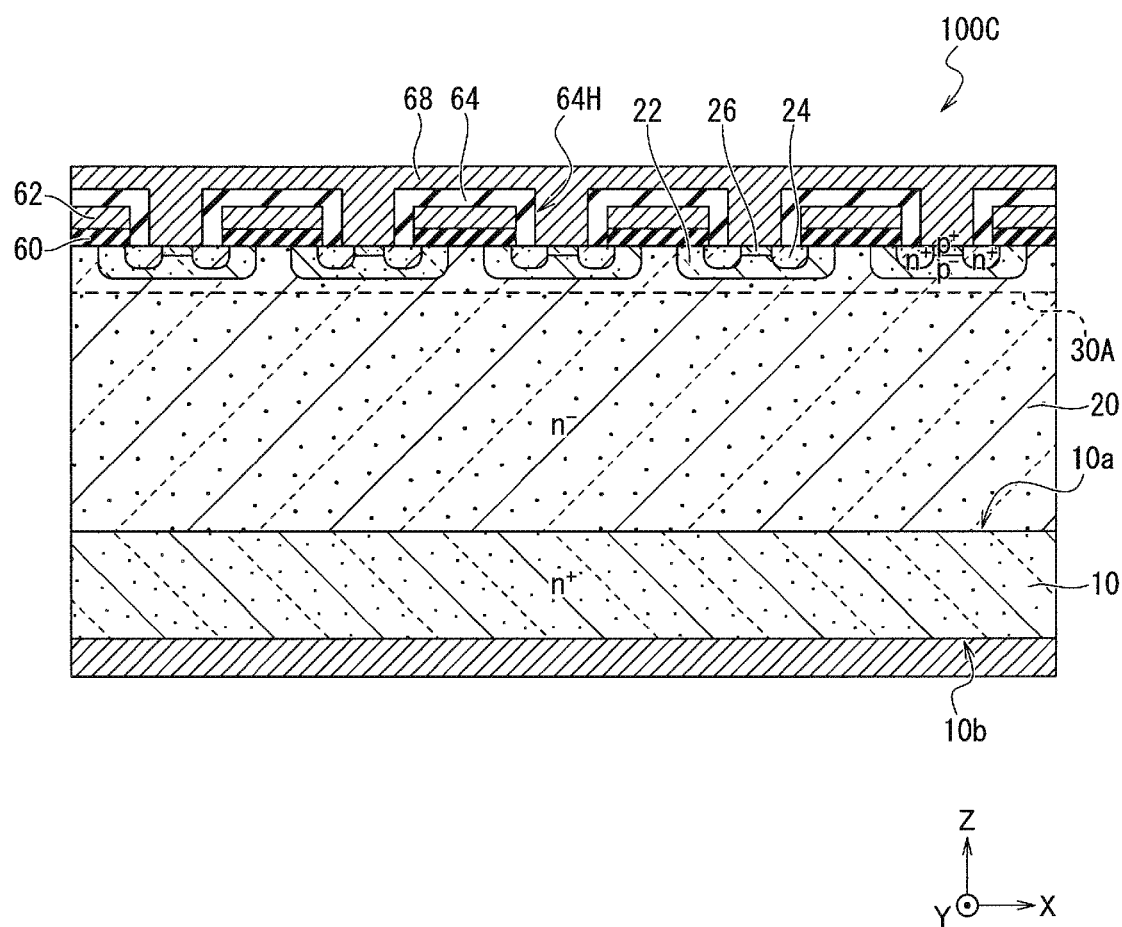
FIG. 15 is a cross-sectional view of a GaN semiconductor device according to a fourth embodiment of the present invention.

FIG. 15 is a cross-sectional view of a GaN semiconductor device 100C according to a fourth embodiment of the present invention. The GaN semiconductor device 100C is an example of the "nitride semiconductor device" of the present invention, and has vertical MOSFET having a planar gate structure. As shown in FIG. 15, in the semiconductor device 100C, an N injected region 30A is formed in the active region 110. The p well regions 22, the n$^+$ source regions 24, and the p$^+$ contact regions 26 are formed within the N injected region 30A in the active region 110.

Similar to the N injected region 30 in the first embodiment, the N injected region 30A is formed by ion-implanting nitrogen (N) into the surface 20a of the GaN layer 20. Similar to the Mg injected region 41 in the first embodiment, the p$^+$ contact region 26 is formed by ion implantation of Mg into the N injected region 30A and a subsequent thermal treatment. Similar to the Mg diffused region 42 in the first embodiment, the p$^-$ well region 22 is formed by thermal diffusion of Mg contained in the p$^+$ contact region 26 into the periphery of the contact region 26 during the above-mentioned thermal treatment.

With this structure, the p$^-$ well region 22 and the p$^+$ contact region 26 may be formed in the p$^-$ well region 22 with ease. Also, because the gate structure is formed in the diffusion region, channels are formed in portions having good p-type properties, and the channel properties can be enhanced as a result. This results in a reduction in the ON resistance of the vertical MOSFET. Further, because the p-type region that is formed by Mg diffusion is used in the pn junction in the active area, depletion in the p$^-$ well region 22 in the active region is relaxed, thereby improving the junction breakdown voltage. Therefore, it is possible to realize a device having a low ON resistance and a high withstand voltage.

Here, similar to the first through third embodiments, the Mg injected regions 41 and the Mg diffused regions 42 may be formed in the edge termination region 130 in the fourth embodiment. In such a case, the N ion implantation conditions for the active region 110 and for the edge termination region 130 may be set as the same so that the N ion implantation is performed in both regions at once. Alternatively, the N ion implantation conditions for these regions may differ, and separate N ion implantation processes may be performed for these regions.

If separate N ion implantation processes are performed for the active region 110 and the edge termination region 130, respectively, the Mg concentration in the p$^-$ well region 22 in the active region 110 and the Mg concentration in the Mg diffused region 42 in the edge termination region 130 will have different profiles with each other. By adjusting the respective N ion implantation conditions, the respective Mg concentrations after the thermal treatment may be designed as desired.

Fifth Embodiment

Figure 16:
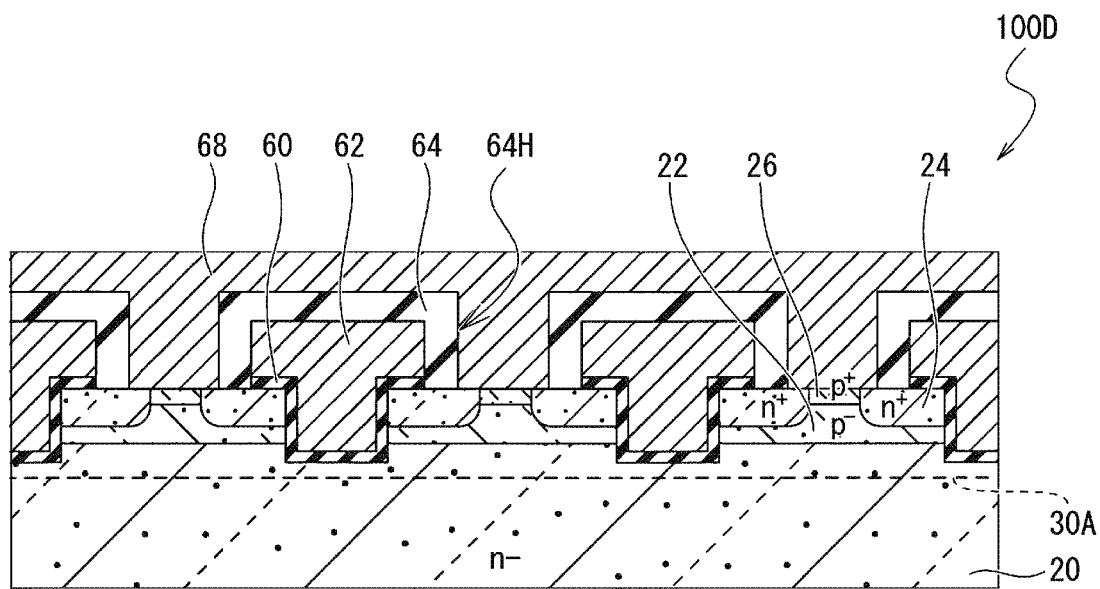
FIG. 16 is a cross-sectional view of a GaN semiconductor device according to a fifth embodiment of the present invention.
Figure 16:
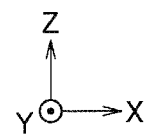

FIG. 16 is a cross-sectional view of a GaN semiconductor device 100D according to a fifth embodiment of the present invention. The GaN semiconductor device 100D is an example of the "nitride semiconductor device" of the present invention, and has MOSFETs having a trench gate structure.

As shown in FIG. 16, in the GaN semiconductor device 100D, an N injected region 30A is formed in the active region 110. The p⁻ well regions 22, the n⁺ source regions 24, and the p⁺ contact regions 26 are formed within the N injected region 30A in the active region 110. Further, in the GaN semiconductor device 100D, trenches are formed in the N injected region 30A in the active region 110, and a gate electrode 62 is formed in each trench with a gate insulating film 60 interposed therebetween.

Similar to the fourth embodiment, the N injected region 30A is formed by ion-implanting nitrogen (N) into the surface 20a of the GaN layer 20. The p⁺ contact region 26 is formed by ion implantation of Mg into the N injected region 30A and a subsequent thermal treatment. The p⁻ well region 22 is formed by thermal diffusion of Mg contained in the p⁺ contact region 26 into the periphery of the contact region 26 during the above-mentioned thermal treatment.

In the fifth embodiment, a plurality of p⁻ well regions 22 are arranged in the horizontal direction. The trenches are formed between the well regions. Each trench penetrates the well region 22 and is bottomed within the N injected region 30A. The gate insulating film 60 is formed so as to cover the bottom and side walls of the trench. The gate electrode 62 is formed so as to be embedded into the trench with the gate insulating film 60 interposed therebetween.

In the fifth embodiment, because the gate structure is formed in the diffusion region, channels are formed in portions having good p-type properties, and the channel properties can be enhanced as a result. This results in a reduction in the ON resistance of the vertical MOSFET. Furthermore, because the p-type region that is formed of Mg diffusion is used in the pn junction in the active area, depletion in the p⁻ well region 22 in the active region can be relaxed, thereby improving the junction withstand voltage. Therefore, it is possible to realize a device having a low ON resistance and a high withstand voltage.

Other Embodiments

Various embodiments and their modifications have been described above. However, the descriptions and drawings explained above do not unduly limit the scope of the present invention. The present disclosure includes various other embodiments and modifications that can be understood by those having ordinary skill in the art based on the disclosure herein. It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

For example, the gate insulating film 60 may be made of silicon oxynitride (SiON), aluminum oxide ($Al_2O_3$), hafnium silicon oxide (HfSiO), or silicon nitride ($Si_3N_4$). Also, the gate insulating film 60 may be a multilayer film by laminating multiple single layer insulating films. When an insulating film other than $SiO_2$ is used, such a vertical MOSFET may also be referred to as a vertical MISFET. The term "MISFET" broadly means an insulating gate type transistor that includes MOSFET.

What is claimed is:

1. A method for manufacturing a nitride semiconductor device, comprising:
    selectively ion-implanting an element that is other than p-type impurities and n-type impurities into a first region in a first primary surface of a gallium nitride layer so as to generate crystal defects in the first region, a concentration of said element being non-zero and substantially constant from the first primary surface to a prescribed depth in a depth direction in the first region, said concentration of the element being higher than in any other regions in the gallium nitride layer;
    selectively ion-implanting a p-type impurity into a second region in the gallium nitride layer, the second region being shallower than the first region in a depth direction and being within the first region in a plan view; and
    thermally treating said gallium nitride layer that has been ion-implanted with said element and said p-type impurity so as to thermally diffuse said p-type impurity in the second region into a third region that is within the first region and that surrounds a bottom and sides of the second region, the third region having said p-type impurity at a concentration lower than a concentration of said p-type impurity in the second region and being deeper than the second region.

2. The method according to claim 1, wherein the ion-implanting of the p-type impurity forms an injection peak of said p-type impurity at a depth that is between the primary surface and a deepest injection peak of said element.

3. The method according to claim 1, wherein the thermally treating forms a first p-type region at and adjacent to the primary surface of the gallium nitride layer, a concentration of the p-type impurity in the first p-type region being equal to or greater than $1.0 \times 10^{19}$ cm⁻³ and less than or equal to $1.0 \times 10^{20}$ cm⁻³.

4. The method according to claim 1, wherein the thermally treating forms a second p-type region that surrounds a bottom and sides of the first p-type region in the primary surface of the gallium nitride layer, a concentration of the p-type impurity in the second p-type region being equal to or greater than $1.0 \times 10^{17}$ cm⁻³ and less than or equal to $1.0 \times 10^{19}$ cm⁻³.

5. The method according to claim 1, wherein said element is nitrogen.

6. The method according to claim 1, wherein said p-type impurity is magnesium.

7. A nitride semiconductor device, comprising:
    a gallium nitride layer containing an element that is other than p-type impurities and n-type impurities in a first region in a first primary surface of the gallium nitride layer, said element generating crystal defects in the first region, a concentration of said element being non-zero and substantially constant from the first primary surface to a prescribed depth in a depth direction in the first region, said concentration of the element being higher than in any other regions in the gallium nitride layer;
    a first p-type region containing a p-type impurity in the gallium nitride layer, the first p-type region being shallower than the first region in a depth direction and being within the first region in a plan view; and
    a second p-type region in the gallium nitride layer, the second p-type region having said p-type impurity at a concentration lower than a concentration of said p-type impurity in the first p-type region and being deeper than the first p-type region.

8. The nitride semiconductor device according to claim 7, wherein the second p-type region is in contact with a bottom and sides of the first p-type region so as to surround the first p-type region.

9. The nitride semiconductor device according to claim 8, wherein the second p-type region has a width of 100 nm or greater in both depth and horizontal directions at a periphery of the first p-type region.

10. The nitride semiconductor device according to claim 7, wherein the concentration of the p-type impurity in the second p-type region is equal to or greater than $1.0 \times 10^{17}$ cm$^{-3}$ and less than or equal to $1.0 \times 10^{19}$ cm$^{-3}$.

11. The nitride semiconductor device according to claim 7, wherein the concentration of the p-type impurity in the first p-type region is equal to or greater than $1.0 \times 10^{19}$ cm$^{-3}$ and less than or equal to $1.0 \times 10^{20}$ cm$^{-3}$.

12. The nitride semiconductor device according to claim 7, wherein a width of a region in a depth direction in which the concentration of the p-type impurity drops from that in the first p-type region to $\frac{1}{10}$ of that in the first p-type region is equal to or less than 100 nm.

13. A nitride semiconductor device, comprising:
a gallium nitride layer containing an element that is other than p-type impurities and n-type impurities in a first region in a first primary surface of the gallium nitride layer, a concentration of the element in the first region being higher than in any other regions in the gallium nitride layer;
a first p-type region containing a p-type impurity in the gallium nitride layer, the first p-type region being shallower than the first region in a depth direction and being within the first region in a plan view; and
a second p-type region in the gallium nitride layer, the second p-type region having said p-type impurity at a concentration lower than a concentration of said p-type impurity in the first p-type region and surrounds a bottom and sides of the first p-type region,
wherein said element is nitrogen.

* * * * *